(12) United States Patent
Ding et al.

(10) Patent No.: US 9,518,319 B2
(45) Date of Patent: *Dec. 13, 2016

(54) LOW-EMISSIVITY GLASS INCLUDING SPACER LAYERS COMPATIBLE WITH HEAT TREATMENT

(71) Applicants: Intermolecular Inc., San Jose, CA (US); Guardian Industries Corp., Auburn Hills, MI (US)

(72) Inventors: Guowen Ding, San Jose, CA (US); Jeremy Cheng, Cupertino, CA (US); Tong Ju, Santa Clara, CA (US); Minh Huu Le, San Jose, CA (US); Daniel Schweigert, Fremont, CA (US); Zhi-Wen Sun, Sunnyvale, CA (US); Yongli Xu, Plymouth, MI (US); Guizhen Zhang, Santa Clara, CA (US)

(73) Assignees: Intermolecular, Inc., San Jose, CA (US); Guardian Industries Corp., Auburn Hills, MI (US)

( * ) Notice: Subject to any disclaimer, the term of this patent is extended or adjusted under 35 U.S.C. 154(b) by 44 days.

This patent is subject to a terminal disclaimer.

(21) Appl. No.: 14/203,182

(22) Filed: Mar. 10, 2014

(65) Prior Publication Data
US 2014/0272395 A1    Sep. 18, 2014

Related U.S. Application Data

(60) Provisional application No. 61/778,758, filed on Mar. 13, 2013.

(51) Int. Cl.
| B32B 15/04 | (2006.01) |
| B32B 17/06 | (2006.01) |
| C23C 14/08 | (2006.01) |
| G02F 1/09 | (2006.01) |
| B29D 11/00 | (2006.01) |

(Continued)

(52) U.S. Cl.
CPC ....... *C23C 14/083* (2013.01); *B29D 11/00865* (2013.01); *C03C 17/36* (2013.01);

(Continued)

(58) Field of Classification Search
USPC ....... 428/426, 428, 432, 433, 434, 688, 689, 428/698, 701, 702
See application file for complete search history.

(56) References Cited

U.S. PATENT DOCUMENTS 5,591,529 A * 1/1997 Braatz .................. G02B 5/208
                                                           359/359
5,821,001 A * 10/1998 Arbab .................... C03C 17/36
                                                           428/623

(Continued)

*Primary Examiner* — Lauren R Colgan

(57) ABSTRACT

Disclosed herein are systems, methods, and apparatus for forming low emissivity panels. A first dielectric layer is disposed over a substrate and includes a bi-metal oxide having tin and bismuth or niobium. A seed layer is disposed directly on the first dielectric layer. A reflective layer including silver is disposed directly on the seed layer. A barrier layer is disposed above the reflective layer. The barrier layer includes one of a nickel chromium titanium aluminum alloy or a nickel chromium titanium aluminum oxide. The nickel chromium titanium aluminum alloy or the nickel chromium titanium aluminum oxide includes between about 5% and about 10% by weight nickel, between about 25% and about 30% by weight chromium, between about 30% and about 35% by weight titanium, and between about 30% and about 35% by weight aluminum.

19 Claims, 5 Drawing Sheets

(51) Int. Cl.
  *G02B 5/26* (2006.01)
  *C03C 17/36* (2006.01)
  *C23C 14/14* (2006.01)
  *E06B 9/24* (2006.01)

(52) U.S. Cl.
  CPC ........ *C03C 17/366* (2013.01); *C03C 17/3639* (2013.01); *C03C 17/3644* (2013.01); *C03C 17/3681* (2013.01); *C23C 14/085* (2013.01); *C23C 14/14* (2013.01); *E06B 9/24* (2013.01); *G02B 5/26* (2013.01); *G02F 1/091* (2013.01); *C03C 2217/43* (2013.01); *C03C 2217/48* (2013.01); *E06B 2009/2464* (2013.01); *G02F 2001/094* (2013.01); *Y10T 428/24975* (2015.01); *Y10T 428/265* (2015.01)

(56) References Cited

U.S. PATENT DOCUMENTS

| | | | |
|---|---|---|---|
| 6,524,714 B1 | 2/2003 | Neuman | |
| 7,005,190 B2 | 2/2006 | Laird | |
| 7,056,588 B2 | 6/2006 | Neuman | |
| 7,153,579 B2 | 12/2006 | Kriltz | |
| 7,419,725 B2 | 9/2008 | Neuman | |
| 7,550,067 B2 | 6/2009 | Veerasamy | |
| 8,147,972 B2 | 4/2012 | Veerasamy | |
| 8,337,988 B2 | 12/2012 | Knoll | |
| 9,206,078 B2 * | 12/2015 | Zhang | C03C 17/3681 |
| 2003/0150711 A1 * | 8/2003 | Laird | C03C 17/36 204/192.11 |
| 2008/0311389 A1 * | 12/2008 | Roquiny | C03C 17/36 428/336 |
| 2009/0004412 A1 * | 1/2009 | Decroupet | C03C 17/36 428/34 |
| 2009/0324967 A1 | 12/2009 | Disteldorf | |
| 2010/0255225 A1 | 10/2010 | Cording | |
| 2010/0279144 A1 | 11/2010 | Frank | |
| 2012/0225304 A1 * | 9/2012 | Imran | C03C 17/36 428/433 |
| 2012/0225317 A1 * | 9/2012 | Imran | C03C 17/36 428/630 |
| 2014/0017472 A1 * | 1/2014 | Coster | B32B 17/10036 428/219 |

* cited by examiner ed States Patent

LOW-EMISSIVITY GLASS INCLUDING SPACER LAYERS COMPATIBLE WITH HEAT TREATMENT

CROSS-REFERENCE TO RELATED APPLICATIONS

This application claims the benefit under 35 U.S.C. §119 (e) of U.S. Provisional Patent Application 61/778,758, filed on 2013-03-13 which is incorporated herein by reference in its entirety for all purposes.

TECHNICAL FIELD

The present disclosure relates generally to low emissivity glass, and more particularly to low emissivity glass including one or more spacer layers that are resistant to heat treatment.

BACKGROUND

Sunlight control materials, such as treated glass sheets, are commonly used for building glass windows and vehicle windows. Such materials typically offer high visible transmission and low emissivity thereby allowing more sunlight to pass through the glass window while block infrared (IR) radiation to reduce undesirable interior heating. In low emissivity (low-E) materials, IR radiation is mostly reflected with minimum absorption and emission, thus reducing the heat transferring to and from the low emissivity surface. Low-E panels are often formed by depositing a reflective layer (e.g., silver) onto a substrate, such as glass. The overall quality of the reflective layer is important for achieving the desired performance. In order to provide adhesion, as well as protection, several other layers are typically formed both under and over the reflective layer. These layers typically include dielectric layers, such as silicon nitride, tin oxide, and zinc oxide, which protect the stack from both the substrate and the environment. The dielectric layers may also act as optical fillers and function as anti-reflective coating layers to improve the optical characteristics of the panel.

A typical approach to reduce emissivity involves increasing the thickness of the reflective layer (e.g., the silver layer). However, as the thickness of the reflective layer increases, the visible light transmission of this layer is also reduced. Furthermore, the high thickness slows manufacturing throughput and increases costs. It may be desirable to keep the reflective layer as thin as possible, while still providing emissivity suitable for low-e applications.

SUMMARY

Disclosed herein are systems, methods, and apparatus for forming low-emissivity (low-E) panels. In some embodiments, the low emissivity panels may include a first reflective layer, a second reflective layer, and a spacer layer disposed between the first reflective layer and the second reflective layer. In some embodiments, the spacer layer may have a thickness of between about 20 nm and 90 nm. The spacer layer may have a substantially amorphous structure. Moreover, the spacer layer may have a substantially uniform composition throughout the thickness of the spacer layer. In some embodiments, the low emissivity panel may be configured to have a color change as determined by Rg ΔE (i.e. as determined on the glass side) that is less than about 1.7 in response to an application of a heat treatment to the low emissivity panel.

The spacer layer may include a bi-metal oxide that may include tin. The bi-metal oxide may also include one of zinc, aluminum, or magnesium. In some embodiments, the bi-metal oxide may include zinc tin oxide, and an atomic ratio of zinc to tin in the zinc tin oxide is between about 1.8:1 and 2.2:1. In some embodiments, the bi-metal oxide may include tin aluminum oxide, and an atomic ratio of aluminum to tin in the tin aluminum oxide is between about 0.1:1 and 0.2:1. In some embodiments, the bi-metal oxide may include tin magnesium oxide, and an atomic ratio of magnesium to tin in the tin magnesium oxide is between about 0.1:1 and 0.2:1.

In some embodiments, a combined sheet resistance of the first reflective layer, the second reflective layer, and the spacer layer may be less than 7 Ohms/square. In some embodiments, the low emissivity panels may further include a barrier layer disposed between the first reflective layer and the spacer layer. The barrier layer may include one of a nickel titanium niobium alloy or silicon nitride. In some embodiments, the barrier layer may directly interface the first reflective layer and the spacer layer. Moreover, the spacer layer may directly interface the barrier layer and the second reflective layer such that the only layers between the first reflective layer and the second reflective layer are the spacer layer and barrier layer. According to some embodiments, the low emissivity panels may also include another barrier layer disposed above the second reflective layer. In some embodiments, the low emissivity panels may also include a seed layer disposed between the spacer layer and the second reflective layer. The seed layer may include one of zinc oxide, tin oxide, scandium oxide, or yttrium oxide.

Also disclosed herein are low emissivity panels that may include a substrate, a first dielectric layer disposed over and directly interfacing the substrate, and a seed layer disposed over and directly interfacing the first dielectric layer. The low emissivity panels may also include a reflective layer disposed over and directly interfacing the seed layer. The first dielectric layer may have a substantially amorphous structure. Moreover, the low emissivity panels may be configured to have a color change as determined by Rg ΔE (i.e. as determined on the glass side) that is less than about 1.7 in response to an application of a heat treatment to the low emissivity panel.

In some embodiments, the first dielectric layer may include a bi-metal oxide that may include tin. The bi-metal oxide may further include one of zinc, aluminum, magnesium, bismuth, or niobium. In some embodiments, the bi-metal oxide may include zinc tin oxide, and an atomic ratio of zinc to tin in the zinc tin oxide may be between about 1.8:1 and 2.2:1. In some embodiments, the bi-metal oxide may include tin aluminum oxide, and an atomic ratio of aluminum to tin in the tin aluminum oxide may be between about 0.1:1 and 0.2:1. In some embodiments, the bi-metal oxide may include tin magnesium oxide, and an atomic ratio of magnesium to tin in the tin magnesium oxide is between about 0.1:1 and 0.2:1. The first dielectric layer has a thickness of at least about 20 nm.

Further disclosed herein are methods of fabricating low emissivity panels. The methods may include providing a substrate, forming a first dielectric layer directly on the substrate, and forming a seed layer directly on the first dielectric layer. The method may further include forming a first reflective layer directly on the seed layer and forming a spacer layer above the first reflective layer. The method may also include forming a second reflective layer above the spacer layer and applying a heat treatment to the low emissivity panel. In some embodiments, the spacer layer may have a substantially amorphous structure. Moreover, the spacer layer may include a bi-metal oxide that may include tin. In some embodiments, a color of a glass-side reflection of the low emissivity panel may change by less than 2% after the application of the heat treatment to the low emissivity panels. In some embodiments, applying the heat treatment to the low emissivity panels comprises heating the low emissivity panels at a temperature of 650 degrees Celsius for 8 minutes.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

DETAILED DESCRIPTION OF EXAMPLE EMBODIMENTS

Figure 1:
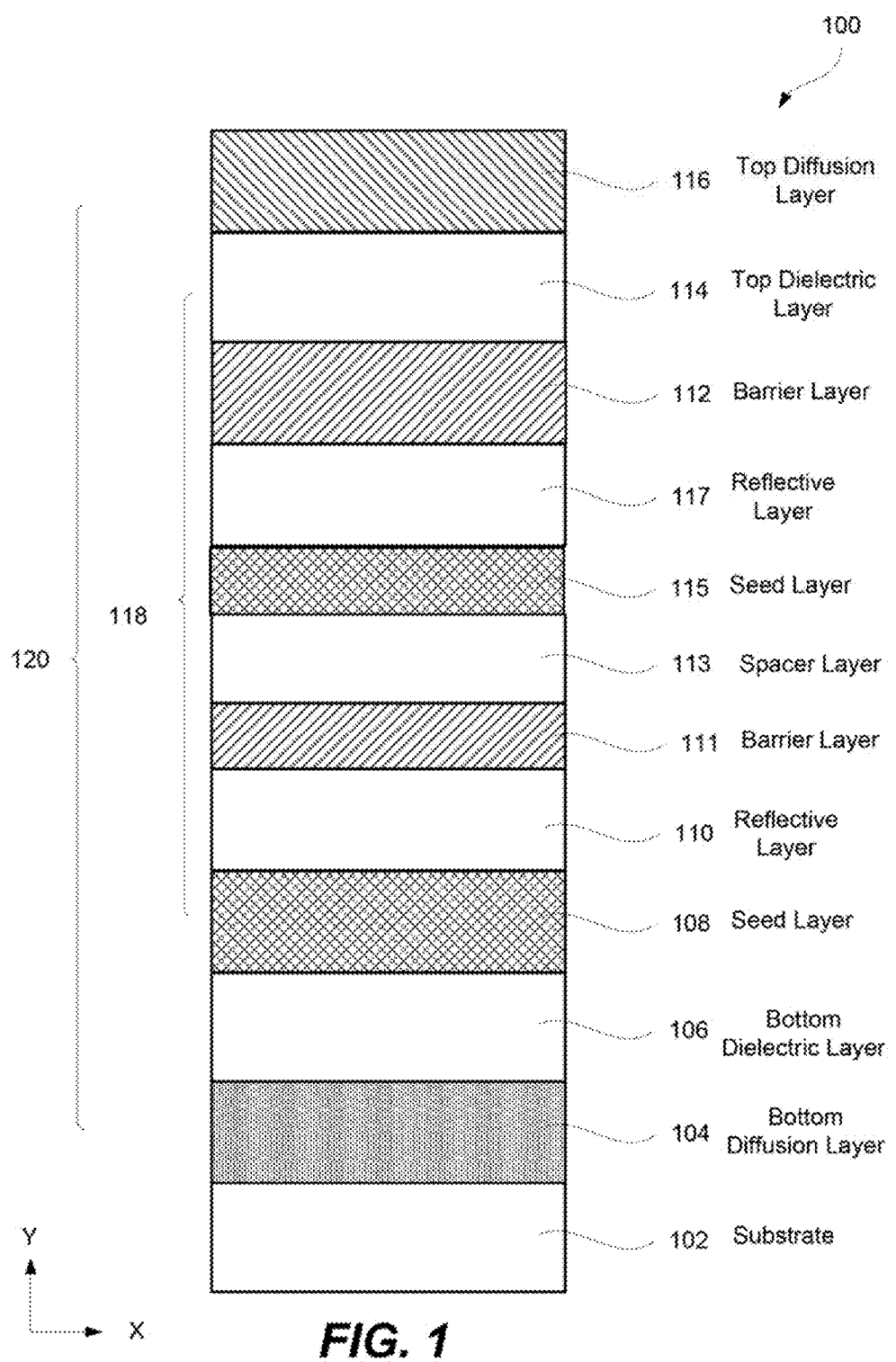
FIG. 1 is a schematic illustration of an article including a substrate and a stack of layers including two or more reflective layers formed over the substrate, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, the notation "Al—Zn—Sn—O" and "AlZnSnO" and "AlZnSnO$_x$" will be understood to be equivalent and will be used interchangeably and will be understood to include a material containing these elements in any ratio. Where a specific composition is discussed, the atomic concentrations (or ranges) will be provided. The notation is extendable to other materials and other elemental combinations discussed herein.

As used herein, the terms "film" and "layer" will be understood to represent a portion of a stack. They will be understood to cover both a single layer as well as a multi-layered structure (i.e. a nanolaminate). As used herein, these terms will be used synonymously and will be considered equivalent.

Introduction

Provided are low emissivity panels and methods of fabricating such panels. A low emissivity panel may include two reflective layers and a spacer layer disposed between the two reflective layers. The spacer layer may have a thickness of between about 20 nm and 90 nm and have a substantially amorphous structure even at these thickness values. In some embodiments, a material may be a substantially amorphous material if the crystalline phase composes less than 5% of the material by volume. Furthermore, the spacer layer may have a substantially uniform composition throughout the thickness of the spacer layer. This design differs from spacer structures used in conventional low emissivity panels, which include multiple alternating oxide layers and nitride layers. Low emissivity panels with a single spacer layer described herein are simpler and less expensive to manufacture and have superior optical characteristics in comparison to conventional low emissivity panels. For example, eliminating nitride layers between two reflective layers reduces color shifting that typically caused by heat treatment.

In some embodiments, the spacer layer is formed from a bi-metal oxide, in which one metal is tin. Unlike tin oxide that is used in conventional panels and that does not include other metals, this bi-metal oxide retains its amorphous properties even when formed into structures having thicknesses of about 50 nm and more. To the contrary, tin oxide rapidly tends to crystallize when formed into structures thicker than 20 nm. As such, in order to build up a spacer structure having a greater thickness tin oxide layers are typically alternated with silicon nitride, which makes fabrication more complex and expensive.

Another metal of the bi-metal oxide of the spacer layer may be zinc, aluminum, or magnesium. For example, the bi-metal oxide may include zinc tin oxide, in which an atomic ratio of zinc to tin may be between about 1.8:1 and 2.2:1. In another example, the bi-metal oxide may include tin aluminum oxide, in which an atomic ratio of aluminum to tin may be between about 0.1:1 and 0.2:1. Furthermore, the bi-metal oxide may include tin magnesium oxide, in which an atomic ratio of magnesium to tin may be between about 1.8:1 and 2.2:1.

In some embodiments, the low emissivity panels include a substrate, a first dielectric layer disposed over and directly interfacing with the substrate, a seed layer disposed over and directly interfacing the first dielectric layer, and a reflective layer disposed over and directly interfacing the seed layer. The first dielectric layer may have the same composition and properties as the spacer layer described above. Specifically, the first dielectric layer may have a substantially amorphous structure. The first dielectric layer may be formed from a bi-metal oxide, which includes tin as one of its metals. Replacing tin oxide with the bi-metal oxides allows eliminating a bottom diffusion layer, which is conventionally disposed between the substrate and the bottom dielectric layer.

As noted above, the first dielectric layer directly interfaces the substrate and no other layers are provided in between the first dielectric layer and the substrate.

Examples of Low-Emissivity Coatings

A brief description of low-E coatings is provided for context and better understanding of various features associated with barrier layers and silver reflective layers. One having ordinary skills in the art would understand that these barrier and silver reflective layers may be also used for other applications, such as light emitting diodes (LED), reflectors, and other like applications. Some characteristics of low-E coatings are applicable to these other applications as well. For purposes of this disclosure, low-E is a quality of a surface that emits low levels of radiant thermal energy. Emissivity is the value given to materials based on the ratio of heat emitted compared to a blackbody, on a scale of 0 (for a perfect reflector) to 1 (for a back body). The emissivity of a polished silver surface is 0.02. Reflectivity is inversely related to emissivity. When values of reflectivity and emissivity are added together, their total is equal to 1.

FIG. 1 is a schematic illustration of an article 100 including a substrate 102 and a stack 120 of layers 104-117, in accordance with some embodiments. Specifically, stack 120 includes one or more reflective layers, such as reflective layer 110 which may be formed over substrate 102 and protected by a barrier layer, such as barrier layer 111. Other layers in stack 120 may include bottom diffusion layer 104, top diffusion layer 116, bottom dielectric layer 106, top dielectric layer 114, and seed layer 108. Stack 120 may further include another reflective layer, such as reflective layer 117, which may be protected by barrier layer 112. Moreover, stack 120 may also include one or more layers between the reflective layers, such as spacer layer 113. Each one of these components will now be described in more detail. One having ordinary skills in the art would understand that the stack may include fewer layers or more layers as, for example, described below with reference to FIG. 2 and FIG. 3.

Substrate 102 can be made of any suitable material. Substrate 102 may be opaque, translucent, or transparent to visible light. For example, for low-E applications, the substrate may be transparent. Specifically, a transparent glass substrate may be used for this and other applications. For purposes of this disclosure, the term "transparency" is defined as a substrate characteristic related to a visible light transmittance through the substrate. The term "translucent" is defined as a property of passing the visible light through the substrate and diffusing this energy within the substrate, such that an object positioned on one side of the substrate is not visible on the other side of the substrate. The term "opaque" is defined as a visible light transmittance of 0%. Some examples of suitable materials for substrate 102 include, but are not limited to, plastic substrates, such as acrylic polymers (e.g., polyacrylates, polyalkyl methacrylates, including polymethyl methacrylates, polyethyl methacrylates, polypropyl methacrylates, and the like), polyurethanes, polycarbonates, polyalkyl terephthalates (e.g., polyethylene terephthalate (PET), polypropylene terephthalates, polybutylene terephthalates, and the like), polysiloxane containing polymers, copolymers of any monomers for preparing these, or any mixtures thereof. Substrate 102 may be also made from one or more metals, such as galvanized steel, stainless steel, and aluminum. Other examples of substrate materials include ceramics, glass, and various mixtures or combinations of any of the above.

Bottom diffusion layer 104 and top diffusion layer 116 may be two layers of stack 120 that protect the entire stack 120 from the environment and improve chemical and/or mechanical durability of stack 120. Diffusion layers 104 and 116 may be made from the same or different materials and may have the same or different thickness. In some embodiments, one or both diffusion layers 104 and 116 are formed from silicon nitride. In some embodiments, silicon nitride may be doped with aluminum and/or zirconium. The dopant concentration may be between about 0% to 20% by weight. In some embodiments, silicon nitride may be partially oxidized. Silicon nitride diffusion layers may be silicon-rich, such that their compositions may be represented by the following expression, $Si_xN_y$, where the X-to-Y ratio is between about 0.8 and 1.0. The refractive index of one or both diffusion layers 104 and 116 may be between about 2.0 and 2.5 or, more specifically, between about 2.15 to 2.25. The thickness of one or both diffusion layers 104 and 116 may be between about 50 Angstroms and 300 Angstroms or, more specifically, between about 100 Angstroms and 200 Angstroms.

In addition to protecting stack 120 from the environment, bottom diffusion layer 104 may help with adhering bottom dielectric layer 106 to substrate 102. Without being restricted to any particular theory, it is believed that deposition of dielectric layer 106 and in particular subsequent heat treatment of this layer results in heat-induced mechanical stresses at the interfaces of dielectric layer 106. These stresses may cause delamination of dielectric layer 106 from other layers and coating failure. A particular example is a titanium oxide layer deposited directly onto the glass substrate. However, when silicon nitride diffusion layer 104 is provided between bottom dielectric layer 106 and substrate 102, the adhesion within this three-layer stack remains strong as evidenced by improved durability, especially after heat treatment.

In some embodiments, stack 120 may further include one or more dielectric layers, such as bottom dielectric layer 106 and top dielectric layer 114 as shown in FIG. 1. Dielectric layers 106 and 114 may be used to control reflection characteristics of reflective layer 110 and reflective layer 117 as well as overall transparency and color of stack 120 and, in some embodiments, of article 100. Dielectric layers 106 and 114 may be made from the same or different materials and may have the same or different thickness. In some embodiments, one or both dielectric layers 106 and 114 are formed from one of $TiO_2$, ZnO, $SnO_2$, SiAlN, or ZnSn. In general, dielectric layers 106 and 114 may be formed from various oxides, stannates, nitrides, and/or oxynitrides. In some embodiments, one or both dielectric layers 106 and 114 may include dopants, such as at least one of Al, Ga, In, Mg, Ca, Sr, Sb, Bi, Ti, V, Y, Zr, Nb, Hf, or Ta. Dielectric layers 106 and 114 can each include different dielectric materials with similar refractive indices or different materials with different refractive indices. The relative thicknesses of the dielectric films can be varied to optimize thermal-management performance, aesthetics, and/or durability of article 100.

The materials of dielectric layers 106 and 114 may be in amorphous phases, crystalline phases, or a combination of two or more phases. In some embodiments, a dielectric layer may be, at least in part, amorphous. As similarly stated above, a material may be a substantially amorphous material if the crystalline phase composes less than 5% of the material by volume. Accordingly, dielectric layer 106 and dielectric layer 114 may each be substantially amorphous. For example, when stack 120 includes seed layer 108, bottom dielectric layer 106 may be substantially amorphous. Alternatively, when stack 120 does not include seed layer 108, bottom dielectric layer 106 may be in a crystalline phase (e.g. greater than 30% crystalline by volume as determined by X-ray diffraction) and may function as a nucleation template for overlying layers, e.g., reflective layer 110. The thickness of dielectric layers 106 and 114 may be between about 50 Angstroms and 1000 Angstroms or, more specifically, between 100 Angstroms and 300 Angstroms.

In some embodiments, stack 120 includes one or more seed layers, such as seed layer 108. A seed layer, such as seed layer 108, may be formed from one of ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. The material of a seed layer may be in a crystalline phase (e.g. greater than 30% crystalline by volume as determined by X-ray diffraction). Accordingly, seed layer 108 may function as a nucleation template for overlying layers, such as reflective layer 110. In some embodiments, the thickness of seed layer 108 is between about 50 Angstroms and 200 Angstroms, such as about 100 Angstroms.

As similarly stated above, stack 120 may include one or more reflective layers, such as reflective layer 110 and reflective layer 117, which may be formed from silver. The thickness of this layer may be between about 50 Angstroms and 200 Angstroms or, more specifically, between about 100 Angstroms and 150 Angstroms.

As noted above, stack 120 also includes barrier layer 112 to protect reflective layer 110 from oxidation and other damage. In some embodiments, barrier layer 112 may be formed from a partially oxidized alloy of at least nickel, titanium, and niobium. In some embodiments, a partially oxidized alloy may be an alloy or metal in which one or more metals included in the alloy have sub-stoichiometric oxidation. Barrier layer 112 may be formed from a quaternary alloy that includes nickel, chromium, titanium, and aluminum. The concentration of each metal in this alloy is selected to provide adequate transparency and oxygen diffusion blocking properties. In some embodiments, a combined concentration of nickel and chromium in the barrier layer is between about 20% by weight and 50% by weight or, more specifically, between about 30% by weight and 40% by weight. A weight ratio of nickel to chromium in the alloy may be between about 3 and 5 or, more specifically, about 4. A weight ratio of titanium to aluminum is between about 0.5 and 2, or more, specifically about 1. In some embodiments, the concentration of nickel in the barrier layer is between about 5% and 10% by weight, the concentration of chromium—between about 25% and 30% by weight, the concentration of titanium and aluminum—between about 30% and 35% by weight each. This composition of barrier layer 112 may be achieved by using one or more sputtering target containing nickel, chromium, titanium, and aluminum, controlling concentration of these metals in the sputtering targets, and controlling power levels applied to each sputtering target. For example, two sputtering targets may be used. The first target may include nickel and chromium, while the second target may include titanium and aluminum. The weight ratio of nickel to chromium in the first target may be about 4, while the weight ratio of titanium to aluminum in the second target may be about 1. These weight ratios may be achieved by using corresponding alloys for the entire target, target inserts made from different materials, or other features allowing combination of two or more materials in the same target. The two targets may be exposed to different power levels. In the above example, the first target may be exposed to twice smaller power than the second target to achieve the desired composition. The barrier can be deposited substantially free of oxygen (e.g., predominantly as a metal) in the inert environment (e.g., argon environment). Alternatively, some oxidant (e.g., 15% by volume of $O_2$ in Ar) may be used to oxide the four metals. The concentration of oxygen in the resulting barrier layer may be between about 0% and 5% by weight.

In some embodiments, nickel, chromium, titanium, and aluminum are all uniformly distributed throughout the barrier layer, i.e., its entire thickness and coverage area. Alternatively, the distribution of components may be non-uniform. For example, nickel and chromium may be more concentrated along one interface than along another interface. In some embodiments, a portion of the barrier layer near the interface with the reflective layer includes more nickel for better adhesion to the reflective layer. In some embodiments, substantially no other components other than nickel, chromium, titanium, and aluminum are present in barrier layer 112.

As stated above, barrier layer 112 may include a material that is an alloy of several metals. For example, barrier layer 112 may be a layer of a material, such as NiTiNb which may be configured to have a thickness between about 1.5 nm and 5 nm. In one example, barrier layer 112 has a thickness of 2.4 nm. Barrier layer 112 may be formed using a deposition technique, such as sputtering. During the forming process, a small amount of oxygen may be mixed with Argon to create a layer of NiTiNb oxide having an oxygen content between 10% to 30% by atomic weight. In some embodiments, barrier layer 112 may have a thickness of between about 1 Angstrom and 100 Angstroms or, more specifically, between about 5 Angstroms and 30 Angstroms, and even between about 10 Angstroms and 20 Angstroms.

Without being restricted to any particular theory, it is believed that when the barrier layer is exposed to oxygen (e.g., during deposition of the top dielectric), some metals of the barrier layer (e.g., Cr, Ti, and Al) will be easily oxidized thereby consuming oxygen and preventing oxygen from penetrating through the barrier layer and reaching the reflective layer. As such, the barrier layer may be considered as a scavenging layer.

In some embodiments, reflective layers included in stack 120 may be separated by one or more layers which may include a spacer layer, such as spacer layer 113. A spacer layer may be included in stack 120 and between reflective layer 110 and reflective layer 117 to achieve a high light to solar gain ratio, which may be greater than 1.8. In some embodiments, spacer layer 113 may be made of one or more materials that enable the formation of a sufficiently thick spacer layer that remains substantially amorphous, even after the application of a heat treatment to article 100.

$$\Delta E^* = \sqrt{(\Delta L^*)^2 + (\Delta a^*)^2 + (\Delta b^*)^2}$$

where:

$\Delta L^* = L_1^* - L_0^*$
$\Delta a^* = a_1^* - a_0^*$
$\Delta b^* = b_1^* - b_0^*$

TABLE 1

| | Materials | | | | | |
|---|---|---|---|---|---|---|
| | $Zn_2SnO_4$ | $SnAlO_x$ (6.5%) | $SnAlO_x$ (12.5%) | $SnO_2$ | $SnMgO_x$ (7.5%) | $SnMgO_x$ (10.5%) |
| Rs (ohms/sq) | 6.52 | 6.35 | 6.08 | 6.34 | 9.06 | 6.58 | 6.95 |
| Emissivity (%) | 7.9 | 7.8 | 7.5 | 8 | 11.7 | 8.3 | 8.79 |
| Emissivity/Rs | 1.22 | 1.23 | 1.23 | 1.27 | 1.29 | 1.26 | 1.26 |
| TT (%) | 88.21 | 83.13 | 86.67 | 86.6 | 79.4 | 88.23 | 85.34 |
| TRf (%) | 4.84 | 8.57 | 5.25 | 4.48 | 4.04 | 4.5 | 4.11 |
| TRg (%) | 5.62 | 11.34 | 5.22 | 5.12 | 7.11 | 5.47 | 5.04 |
| Avis (100 − TT − TRf) | 6.95 | 8.3 | 8.08 | 8.92 | 16.56 | 7.27 | 10.55 |

As Table 1 illustrates, a single conventional spacer layer which may include only $SnO_x$ exhibits a large resistance and is not suitable for low-E applications. Further, the $SnO_x$ will generally crystallize due to subsequent heat treatments, thus imparting a color change to the coated article after heat treatment. Also, it can be noted that the absorbance of the $SnO_x$ is much higher than the $AlSnO_x$. Thus, as previously discussed, conventional spacer layers include multiple thinner layers of $SnO_x$ with nitride layers interspersed. However, the spacer layers disclosed herein, such as spacer layer 113, may be formed of a single layer of a bi-metal oxide. Accordingly, spacer layer 113 may be formed using a simple manufacturing process that eliminates the need for additional spacer layers and nitride layers which may be interspersed between conventional $SnO_x$ layers. By eliminating nitride layers that may be included with conventional $SnO_x$ layers, color shifting typically caused by heat treatments may be eliminated. Accordingly, in contrast to conventional spacer layers that may include several layers of $SnO_x$ and nitride layers, one or more spacer layers disclosed herein do not experience a substantial change in color and transmissivity or an increase in film haze and maintain resistance and emissivity characteristics that are suitable for low-E applications.

More specifically, low emissivity panels that include spacer layers as disclosed herein may have a have a color change as determined by Rg ΔE (i.e. as determined on the glass side), which may be a metric that describes a change in color of a low emissivity panel, or one or more layers included in the low emissivity panel. For example, color characteristics may be described using the CIE LAB a*, b* coordinates and scale. In the CIE LAB color system, the "L*" value indicates the lightness of the color, the "a*" value indicates the position between magenta and green (more negative values indicate stronger green and more positive values indicate stronger magenta), and the "b*" value indicates the position between yellow and blue (more negative values indicate stronger blue and more positive values indicate stronger yellow). In various embodiments, a ΔE value may be calculated based on a difference in L*, a*, and b* values before and after the application of a heat treatment to a low emissivity panel. For example, a ΔE value may be determined based on color properties before heat treatment ($L_0^*$, $a_0^*$, $b_0^*$) and color properties after heat treatment ($L_1^*$, $a_1^*$, $b_1^*$). ΔE may be calculated based on the following equation:

In some embodiments, low emissivity panels as disclosed herein may have a color change as determined by Rg ΔE (i.e. as determined on the glass side) that is less than about 2. Further still, the Rg ΔE may be less than about 1.7. Accordingly, as discussed in greater detail below with reference to FIG. 5, low emissivity panels that include one or more spacer layers, such as spacer layer 113, may experience very little shift in color in response to the application of a heat treatment to the low emissivity panel.

Moreover, low emissivity panels that include spacer layers as disclosed herein may exhibit a very low amount of haze because they may include so few layers between reflective layers, and do not include layers having nitrides. In some embodiments, haze may be a standard measurement of a transmittance characteristic of a low emissivity panel, such as an amount of light scattered. For example, haze may be determined based on the ratio of diffuse or scattered light relative to the total light transmitted through the low emissivity panel. For example, the amount of haze after the application of a heat treatment to a low emissivity panel as disclosed herein may be less than about 5%. For example, the amount of haze may be about 4.7% after the application of a heat treatment to a low emissivity panel that includes a spacer layer, such as spacer layer 113.

In some embodiments, spacer layer 113 may have a thickness sufficiently large to provide a high light to solar gain ratio while not degrading emissivity performance of the article 100 and low-E panels that may include article 100. Applicants have determined that a spacer layer as disclosed herein may preferably have a thickness of between about 20 nm and 90 nm and achieve sufficient light to solar gain ratio and emissivity performance. In some embodiments, spacer layer 113 maintains a low resistance and emissivity. For example, portion 118 and/or stack 120 that may include spacer layer 113 may each have a sheet resistance of less than 7 Ohms/square while maintaining a high total transmission. In some embodiments, a spacer layer, such as spacer layer 113, may have a substantially amorphous structure even at these thickness values. Conventional layers are susceptible to crystallization at such thicknesses. However, a spacer layer having a composition as disclosed herein may remain substantially amorphous and have a substantially uniform composition throughout the thickness of the spacer layer.

Accordingly, spacer layer 113 may be formed from a bi-metal oxide. In some embodiments, a first metal included in the bi-metal oxide may be tin. Tin oxide, when used on its own, tends to rapidly crystallize when formed into structures thicker than 20 nm. Conventional methods of forming thicker layers typically include alternating layers of tin oxide and silicon nitride, which are susceptible to the problems discussed above. Applicants have determined that unlike tin oxide that may be used in conventional low-E panels and that does not include any other metals, a bi-metal oxide as disclosed herein retains its amorphous properties even when formed into structures having thicknesses of about 50 nm or more.

In some embodiments, the bi-metal oxide may also include a metal such as zinc, aluminum, or magnesium. For example, the bi-metal oxide may include zinc tin oxide, in which an atomic ratio of zinc to tin may be between about 1.8:1 and 2.2:1. In another example, the bi-metal oxide may include tin aluminum oxide, in which an atomic ratio of aluminum to tin may be between about 0.1:1 and 0.2:1. Furthermore, the bi-metal oxide may include tin magnesium oxide, in which an atomic ratio of magnesium to tin may be between about 1.8:1 and 2.2:1. As similarly discussed above and in further detail below with reference to FIG. 4 and FIG. 5, a spacer layer, such as spacer layer 113, may undergo a treatment, such as a heat treatment. These materials have a lower absorbance than tin oxide (as illustrated in Table 1) and these materials will remain amorphous after subsequent heat treatments, thereby allowing the color change to be negligible after the heat treatment.

Stack 120 may further include seed layer 115. As similarly discussed above with reference to seed layer 108, seed layer 115 may be formed from one of ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. Seed layer 115 may be in a crystalline phase (e.g. greater than 30% crystalline by volume as determined by X-ray diffraction). In some embodiments, the thickness of seed layer 115 is between about 50 Angstroms and 200 Angstroms, such as about 100 Angstroms.

Stack 120 may also include barrier layer 111 which may be formed over reflective layer 110. For example, barrier layer 111 may be formed between reflective layer 110 and spacer layer 113, and may directly interface spacer layer 113 and reflective layer 110. Barrier layer 111 may protect reflective layer 110 from oxidation and other damage. As similarly discussed above with reference to barrier layer 112, barrier layer 111 may be formed from a partially oxidized alloy of at least nickel, titanium, and niobium. Moreover, barrier layer 111 may be made of silicon nitride.

Top diffusion layer 116 may be similar to bottom diffusion layer 104 described above. In some embodiments, top diffusion layer 116 (e.g., formed from silicon nitride) may be more stoichiometric than bottom diffusion layer 104 to give better mechanical durability and give a smoother surface. Bottom diffusion layer 104 (e.g., formed from silicon nitride) can be silicon-rich to make film denser for better diffusion effect.

While FIG. 1 illustrates a stack, such as stack 120, including two reflective layers, in some embodiments, a stack may include additional reflective layers in order to achieve a specific performance. For example, the stack may include three or more reflective layers. The multiple reflective layers may have the same or different composition and/or thicknesses. Each new reflective layer may have a corresponding seed layer and barrier layer. FIG. 1 illustrates a portion 118 of stack 120 that may be repeated. Portion 118 includes dielectric layer 106 (or dielectric layer 114), seed layer 108, reflective layer 110, spacer layer 113, seed layer 115, reflective layer 117, and barrier layer 112. In some embodiments, portion 118 might not include seed layer 108.

Figure 2:
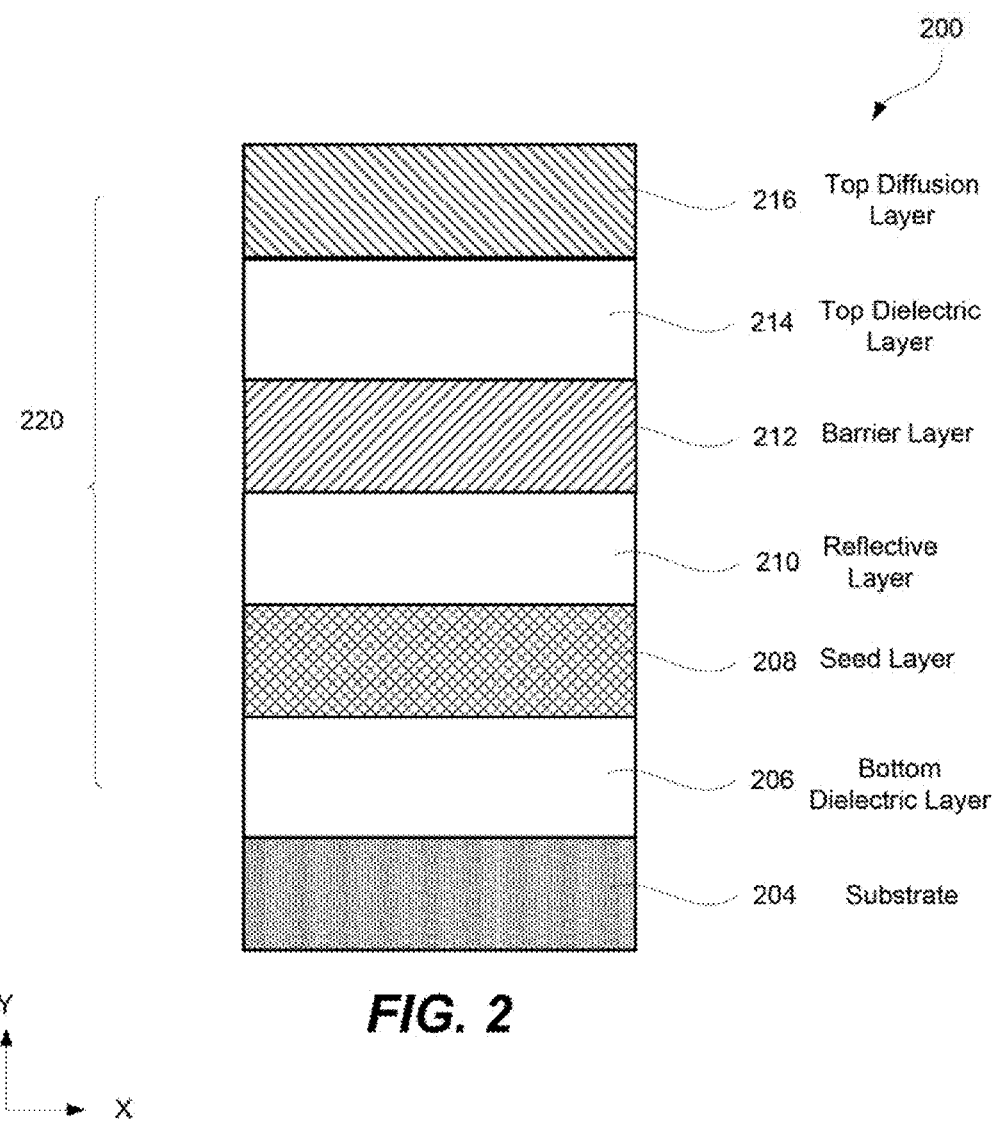
FIG. 2 is a schematic illustration of another article including a substrate and a stack of layers including one or more reflective layers formed over the substrate, in accordance with some embodiments.

FIG. 2 is a schematic illustration of another article 200 including substrate 204 and a stack including reflective layer 210, in accordance with some embodiments. Article 200 may further include bottom dielectric layer 206, seed layer 108, reflective layer 210, barrier layer 212, top dielectric layer 214, and top diffusion layer 216. As similarly discussed above with reference to FIG. 1, a reflective layer, such as reflective layer 206, may include silver. Moreover, seed layer 208 may include a metal oxide, as previously discussed with reference to seed layer 108 of FIG. 1, such as zinc oxide, titanium oxide, or tin oxide. Barrier layer 212 may include a partially oxidized alloy of at least nickel, titanium, and niobium.

In some embodiments, one or more of the dielectric layers included in article 200 may have the same composition and properties as a spacer layer described above with reference to spacer layer 113 of FIG. 1. Accordingly, a dielectric layer such as bottom dielectric layer 206, may have a substantially amorphous structure, may have a thickness of at least about 20 nm, and may be formed from a bi-metal oxide, which includes tin as one of its metals. In some embodiments, the bi-metal oxide further comprises one of zinc, aluminum, magnesium, bismuth, or niobium. Accordingly, the bi-metal may be zinc tin oxide, where an atomic ratio of zinc to tin in the zinc tin oxide is between about 1.8:1 and 2.2:1. Moreover, the bi-metal oxide may include tin aluminum oxide, where an atomic ratio of aluminum to tin in the tin aluminum oxide is between about 0.1:1 and 0.2:1. Further still, the bi-metal oxide may include tin magnesium oxide, where an atomic ratio of magnesium to tin in the tin magnesium oxide is between about 0.1:1 and 0.2:1.

Applicants have determined that replacing tin oxide with the bi-metal oxides allows eliminating a bottom diffusion layer, which may otherwise be formed between substrate 204 and bottom dielectric layer 206. In some embodiments, a dielectric layer, such as bottom dielectric layer 206 directly interfaces substrate 204, and no other layers are provided in between bottom dielectric layer 206 and substrate 204.

Figure 3:
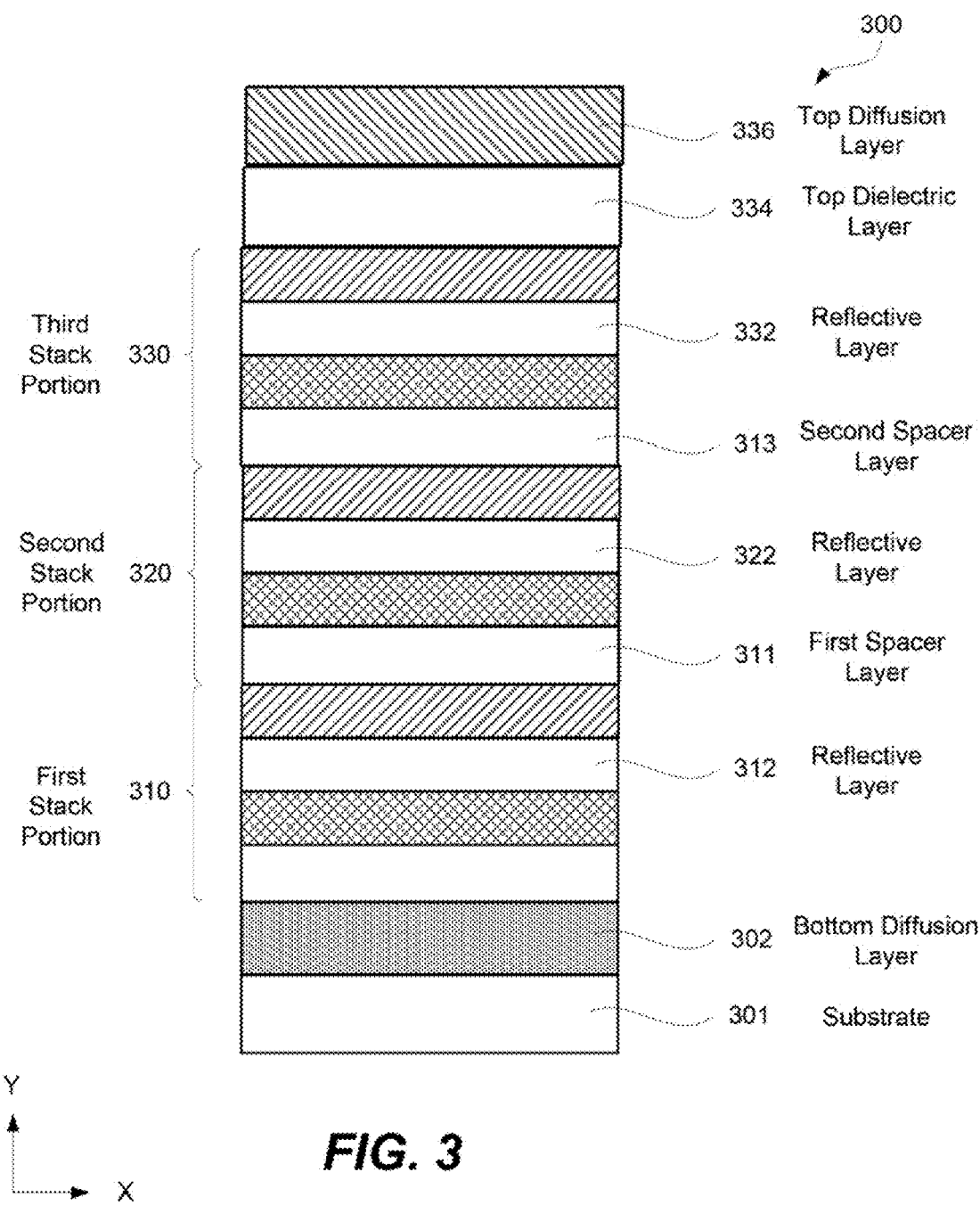
FIG. 3 is a schematic illustration of yet another article including a substrate and a stack of layers including three reflective layers formed over the substrate, in accordance with some embodiments.

FIG. 3 is a schematic illustration of yet another article 300 including substrate 301 and three reflective layers, each being a part of a separate stack portion. Specifically, article 300 includes first stack portion 310 having reflective layer 312, second stack portion 320 having reflective layer 322, and third stack portion 330 having reflective layer 332. Other layers of article 300 also include bottom diffusion layer 302, top dielectric layer 334, and top diffusion layer 336. As similarly discussed above with reference to FIG. 1 and FIG. 2, a reflective layer, such as reflective layer 312, may include silver. Furthermore a dielectric layer may be formed from one of $TiO_2$, ZnO, $SnO_2$, SiAlN, or ZnSn. Article 300 may also include first spacer layer 311 and second spacer layer 313 which may be made of a bi-metal oxide that includes a first metal, such as tin, and a second metal, such as zinc, aluminum, or magnesium.

Processing Examples

Figure 4:
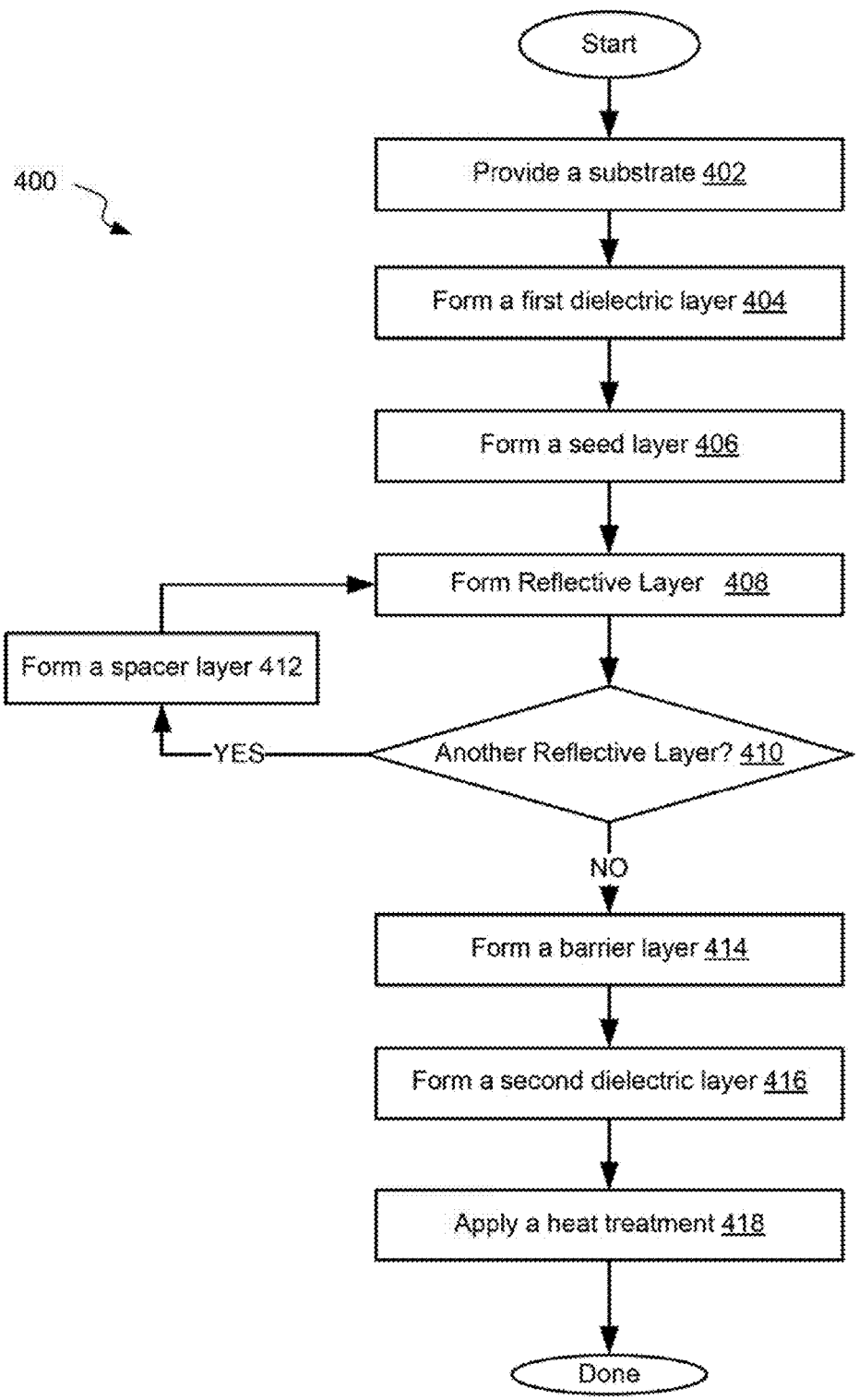
FIG. 4 is a process flowchart corresponding to a method for forming an article including one or more reflective layers and barrier layers for protecting materials in the one or more reflective layers from oxidation, in accordance with some embodiments.

FIG. 4 is a process flowchart corresponding to a method 400 of forming an article including one or more reflective layers and barrier layers for protecting the one or more reflective layers from oxidation, in accordance with some embodiments. Method 400 may commence with providing a substrate during operation 402. In some embodiments, the provided substrate is a glass substrate that is transparent.

Method 400 may proceed with forming a first dielectric layer over the substrate during operation 404. As similarly discussed above with reference to FIG. 1, this operation may involve sputtering titanium or tin in an oxygen containing environment. Moreover, in some embodiments, the first dielectric layer may include a material having a composition similar to those described above with reference to spacer layer 113. In this example, the first dielectric layer may include a bi-metal oxide, and no bottom diffusion layer may be included in the article formed by method 400.

Method 400 may proceed with forming a seed layer over the first dielectric layer during operation 406. As similarly discussed above with reference to FIG. 1, a seed layer may include one of $ZnO$, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. Moreover, the seed layer may be formed using any suitable deposition technique.

Method 400 may proceed with forming a reflective layer over the seed layer during operation 408 or, more specifically, over one or more layers previously formed on the provided substrate. This operation may involve sputtering silver in a non-reactive environment. The silver layer may be deposited in argon environment at a pressure of 2 millitorr using 90 W power applied over a sputter area of about 12 $cm^2$ resulting in a power density of about 7500 $W/m^2$. The resulting deposition rate may be about 2.9 Angstroms per second. The target to substrate spacing may be about 240 millimeters. The thickness of the reflective layer may be between about 50 Angstroms and 200 Angstroms.

During operation 410, it may be determined whether or not an additional reflective layer should be formed in the article, which may be included in a low-E panel. If another reflective layer is to be formed, method 400 may proceed to operation 412. If another reflective layer is not formed, method 400 may proceed to operation 414. Accordingly, in response to determining that another reflective layer should be formed, method 400 may proceed with forming a spacer layer over the reflective layer during operation 412. As similarly discussed above with reference to spacer layer 113 or FIG. 1, a spacer layer may be made of a bi-metal oxide and deposited in a layer that is between about 20 nm to 90 nm thick, is substantially amorphous, and has a substantially homogenous composition throughout its thickness. In some embodiments, the spacer layer may be formed or deposited using a physical vapor deposition (PVD) process which may include reactive sputtering. In some embodiments, multiple chambers may be used during the deposition of the spacer layer.

In response to determining that another reflective layer should not be formed, method 400 may proceed with forming a barrier layer over the reflective layer during operation 414. As noted above, the barrier layer may be formed from an alloy including one or more of nickel, chromium, titanium, niobium, and aluminum that is formed by co-sputtering of these metals in a non-reactive environment. In some embodiments, the barrier layer is deposited in the same processing chamber as the reflective layer without breaking the vacuum in the chamber. Overall, the reflective layer needs to be protected from oxygen prior to deposition of the barrier layer. In some embodiments, a partially fabricated article may be maintained in an oxygen-free environment after forming the reflective layer and prior to forming the barrier layer.

Method 400 may then proceed with forming a second dielectric layer over the barrier layer during operation 416. This operation may involve sputtering titanium or tin in an oxygen containing environment. During this operation, the barrier layer prevents oxygen in the oxygen containing environment from reaching and reacting with metallic silver in the reflective layer.

Method 400 may then proceed with applying a heat treatment to the article during operation 418. In some embodiments, the heat treatment may be a tempering process which may involve heating the article to a temperature of 650 degrees Celsius for up to about 8 minutes. In response to the heat treatment, the color and transmissivity of the article may remain substantially unchanged. For example, a color of a glass-side reflection of a low-E panel that includes the article may change by less than 2%. Moreover, the low-E panel may have a color change as determined by Rg ΔE (i.e. as determined on the glass side) of less than about 1.7.

Figure 5:
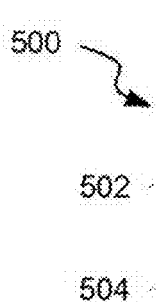
FIG. 5 illustrates an example of a score card describing transmission and glass-side reflection characteristics of low emissivity panels, implemented in accordance with some embodiments.

FIG. 5 illustrates an example of a score card describing transmission and glass-side reflection characteristics of low emissivity panels, implemented in accordance with some embodiments. As shown in FIG. 5, a spacer layer and low emissivity panels that include such spacer layers may exhibit little to no significant change in color, glass-side reflectance, and transmission characteristics in response to the application of a heat treatment to the low emissivity panels. For example, table 500 included in FIG. 5 lists various transmission and reflectance properties of low emissivity panels that may include a spacer layer as disclosed herein. As indicated by the values included in row 502 and row 504, the color change associated with a transmission (T) and glass-side reflection (Rg) is very small for both as-coated (AC) and heat-treated (HT) panels. For example, row 502 indicates that light transmitted by the low emissivity panels has a neutral color and experiences minimal color change for panels with and without a heat treatment (a* and b* values for both AC and HT are relatively close to zero). Moreover, row 504 indicates that a glass-side reflection of the low emissivity panels has a neutral color and experiences minimal color change both with and without a heat treatment (a* and b* values for both AC and HT are relatively close to zero).

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A low emissivity panel comprising:
   a first reflective layer;
   a second reflective layer;
   a spacer layer disposed between the first reflective layer and the second reflective layer, wherein the spacer layer has a thickness of between about 20 nm and 90 nm and a substantially uniform composition throughout the thickness thereof, and wherein the spacer layer comprises a bi-metal oxide, the bi-metal oxide comprising tin and one of bismuth and niobium; and
   a barrier layer disposed between the first reflective layer and the spacer layer, wherein the barrier layer comprises one of a nickel chromium titanium aluminum alloy or a nickel chromium titanium aluminum oxide, wherein the one of the nickel chromium titanium aluminum alloy or the nickel chromium titanium aluminum oxide comprises between about 5% and about 10% by weight nickel, between about 25% and about 30% by weight chromium, between about 30% and about 35% by weight titanium, and between about 30% and about 35% by weight aluminum.

2. The low emissivity panel of claim 1, wherein the low emissivity panel is configured to have a Rg ΔE that is less than about 1.7 in response to an application of a heat treatment to the low emissivity panel.

3. The low emissivity panel of claim 1, wherein the spacer layer consists of the bi-metal oxide.

4. The low emissivity panel of claim 1, wherein the bi-metal oxide consists of bismuth tin oxide or niobium tin oxide.

5. The low emissivity panel of claim 4, wherein each of the first reflective layer and the second reflective layer comprises silver.

6. The low emissivity panel of claim 5, wherein the barrier layer directly interfaces the first reflective layer and the spacer layer.

7. The low emissivity panel of claim 6, further comprising a seed layer disposed between the spacer layer and the second reflective layer, the seed layer consisting of one of zinc oxide, tin oxide, scandium oxide, or yttrium oxide, wherein the seed layer directly interfaces the spacer layer and the second reflective layer.

8. The low emissivity panel of claim 1, wherein the barrier layer consists of the nickel chromium titanium aluminum alloy, and wherein the nickel chromium titanium aluminum alloy consists of between about 5% and about 10% by weight nickel, between about 25% and about 30% by weight chromium, between about 30% and about 35% by weight titanium, and between about 30% and about 35% by weight aluminum.

9. The low emissivity panel of claim 1, wherein the barrier layer consists of the nickel chromium titanium aluminum oxide, and wherein the nickel chromium titanium aluminum oxide consists of between about 5% and about 10% by weight nickel, between about 25% and about 30% by weight chromium, between about 30% and about 35% by weight titanium, between about 30% and about 35% by weight aluminum, and between about 0% and about 5% by weight oxygen.

10. The low emissivity panel of claim 1, further comprising a second barrier layer disposed directly on the second reflective layer, wherein the second barrier layer comprises the one of the nickel chromium titanium aluminum alloy or the nickel chromium titanium aluminum oxide.

11. A low emissivity panel comprising:
a substrate;
a first dielectric layer disposed over the substrate, wherein the first dielectric layer has a substantially amorphous structure and consists of a bi-metal oxide, the bi-metal oxide comprising tin and one of bismuth and niobium;
a seed layer disposed directly on the first dielectric layer;
a reflective layer disposed directly on the seed layer, wherein the reflective layer comprises silver; and
a barrier layer disposed directly on the reflective layer, wherein the barrier layer comprises one of a nickel chromium titanium aluminum alloy or a nickel chromium titanium aluminum oxide, wherein the one of the nickel chromium titanium aluminum alloy or the nickel chromium titanium aluminum oxide comprises between about 5% and about 10% by weight nickel, between about 25% and about 30% by weight chromium, between about 30% and about 35% by weight titanium, and between about 30% and about 35% by weight aluminum.

12. The low emissivity panel of claim 11, wherein the bi-metal oxide consists of bismuth tin oxide or niobium tin oxide.

13. The low emissivity panel of claim 11, wherein the barrier layer consists of the one of the nickel chromium titanium aluminum alloy or the nickel chromium titanium aluminum oxide.

14. The low emissivity panel of claim 13, further comprising a spacer layer disposed directly on the barrier layer, wherein the spacer layer consists of bismuth tin oxide or niobium tin oxide.

15. The low emissivity panel of claim 14, further comprising a second seed layer disposed directly on the spacer layer, wherein each of the seed layer and the second seed layer consist of one of zinc oxide, tin oxide, scandium oxide, or yttrium oxide.

16. The low emissivity panel of claim 15, further comprising a second reflective layer disposed directly on the second seed layer, wherein the second reflective layer comprises silver.

17. The low emissivity panel of claim 16, wherein the first dielectric layer has a thickness of at least about 20 nm.

18. The low emissivity panel of claim 17, further comprising a second barrier layer disposed directly on the second reflective layer, wherein the second barrier layer comprises the one of the nickel chromium titanium aluminum alloy or the nickel chromium titanium aluminum oxide.

19. The low emissivity panel of claim 18, wherein each of the barrier layer and the second barrier layer consists of the nickel chromium titanium aluminum oxide, and wherein the nickel chromium titanium aluminum oxide consists of between about 5% and about 10% by weight nickel, between about 25% and about 30% by weight chromium, between about 30% and about 35% by weight titanium, between about 30% and about 35% by weight aluminum, and between about 0% and about 5% by weight oxygen.

* * * * *